United States Patent
Shacklette et al.

(10) Patent No.: US 9,478,494 B1
(45) Date of Patent: Oct. 25, 2016

(54) DIGITAL DATA DEVICE INTERCONNECTS

(71) Applicant: HARRIS CORPORATION, Melbourne, FL (US)

(72) Inventors: Lawrence W. Shacklette, Melbourne, FL (US); Michael R. Weatherspoon, West Melbourne, FL (US); Joshua P. Bruckmeyer, W. Melbourne, FL (US); Arthur Wilson, W. Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 14/709,593

(22) Filed: May 12, 2015

(51) Int. Cl.
*H01L 23/528* (2006.01)
*H01L 21/768* (2006.01)

(52) U.S. Cl.
CPC ....... *H01L 23/528* (2013.01); *H01L 21/76895* (2013.01)

(58) Field of Classification Search
CPC .................... H01L 23/528; H01L 21/76895
USPC ........................................................ 257/773
See application file for complete search history.

(56) References Cited

U.S. PATENT DOCUMENTS

| | | | |
|---|---|---|---|
| 3,826,325 A | 7/1974 | Purcell et al. | |
| 4,673,904 A | 6/1987 | Landis | |
| 6,143,616 A | 11/2000 | Geusic et al. | |
| 6,449,308 B1 * | 9/2002 | Knight, Jr. | G06F 13/4086 370/438 |
| 7,552,785 B2 | 6/2009 | Tuhy | |
| 7,597,161 B2 | 10/2009 | Brazier | |
| 7,649,432 B2 | 1/2010 | Sherrer et al. | |
| 7,656,256 B2 | 2/2010 | Houck et al. | |
| 7,781,727 B2 | 8/2010 | Sherrer et al. | |
| 7,888,793 B2 | 2/2011 | Sherrer et al. | |
| 7,898,356 B2 | 3/2011 | Sherrer et al. | |
| 7,948,335 B2 | 5/2011 | Sherrer et al. | |
| 8,031,037 B2 | 10/2011 | Sherrer et al. | |
| 8,542,079 B2 | 9/2013 | Sherrer et al. | |

(Continued)

FOREIGN PATENT DOCUMENTS

| | | |
|---|---|---|
| EP | 1939137 A2 | 7/2008 |
| EP | 1939974 A1 | 7/2008 |
| WO | 92/05457 A1 | 4/1992 |

OTHER PUBLICATIONS

Abusultan, M and LaMeres, B.J., Off-Chip Coaxial-to-Coplanar Transition Using MEMs Trench, 3D/SiP Advanced Packaging Symposium, Apr. 28-30, 2008 (5 pages).

(Continued)

*Primary Examiner* — Fernando L Toledo
*Assistant Examiner* — Adam S Bowen
(74) *Attorney, Agent, or Firm* — Fox Rothschild LLP; Robert J. Sacco; Carol E. Thorstad-Forsyth

(57) ABSTRACT

Digital data system disposed on a substrate includes a digital data device and at least one digital data interconnect disposed on the substrate. The digital data interconnect is comprised of a plurality of material layers stacked to form a three-dimensional structure. The material layers form a conductive shield, a plurality of straps which are periodically spaced along an interior length of the shield, and a core which includes one or more conductors. The conductors extends along the length of the tubular form parallel to the opposing walls and are suspended on the straps, separated from the conductive shield by an air gap. First and second conductors of the core can facilitate a differential signaling mode.

19 Claims, 7 Drawing Sheets

(56) References Cited

U.S. PATENT DOCUMENTS

| | | | |
|---|---|---|---|
| 8,659,371 B2 | 2/2014 | Fonataine et al. | |
| 8,698,577 B2 | 4/2014 | Sherrer et al. | |
| 8,703,603 B2 | 4/2014 | Sherrer et al. | |
| 8,717,124 B2 | 5/2014 | Vanhille et al. | |
| 8,742,874 B2 | 6/2014 | Sherrer et al. | |
| 8,814,601 B1 | 8/2014 | Sherrer et al. | |
| 8,866,300 B1 | 10/2014 | Sherrer et al. | |
| 8,917,150 B2 | 12/2014 | Vanhille et al. | |
| 8,933,769 B2 | 1/2015 | Houck et al. | |
| 2003/0214802 A1* | 11/2003 | Fjelstad | H01P 3/088 361/826 |
| 2007/0194431 A1* | 8/2007 | Corisis | H01L 23/66 257/698 |
| 2008/0246562 A1 | 10/2008 | Sherrer et al. | |
| 2009/0267201 A1 | 10/2009 | Chang et al. | |
| 2010/0097158 A1 | 4/2010 | Eppich et al. | |
| 2010/0109819 A1* | 5/2010 | Houck | B81B 3/0059 333/243 |
| 2014/0300428 A1 | 10/2014 | Toyao | |

OTHER PUBLICATIONS

Moubarak, P.M., "On the Dual-Rod Slider rocker Mechanism and Its Applications to Tristate Rigid Active Docking," Journal of Mechanisms and Robotics, Copyright 2013 by ASME, Feb. 2013, vol. 5/011010-1.

Dollar, A.M., et al., "Joint Coupling Design of Underactuated Grippers," Proceedings ofl DETC/CIE 2006, ASME 2006 International Design Engineering Technical Conferences & Computers and Information in Engineering Conference; Sep. 10-13, 2006, Philadelphia, PA, copyright 2006 by DEAS.

* cited by examiner

DIGITAL DATA DEVICE INTERCONNECTS

BACKGROUND OF THE INVENTION

1. Statement of the Technical Field

This document relates to electronic interconnection structures, and more particularly to microstructures which facilitate high-speed interconnections between certain types of devices for communicating and sharing data.

2. Description of the Related Art

There is a general and continuing need for faster data transport between electronic devices disposed on substrates. One commonly utilized method for increasing data rates between two devices disposed on a substrate involves providing a plurality of parallel data link channels. By increasing the number of data link channels, the data throughput limitations of each individual link can be overcome. But the data rate improvements which have been obtained by using parallel data links are reaching their limit. This is due to the growing number of required I/O pads, the increase in power dissipated as a result of a growing number of on chip driver and receiver circuits (and associated limits with regard to how much heat can be removed from the device), and the difficulty of routing traces and compensating for faults.

Digital devices such as central processing units (CPUs), graphics processing units (GPUs), and field programmable gate arrays (FPGAs) have been moving to increasingly higher data rates for serial I/O (e.g., Xilinx Virtex®-7 HT FPGAs at 28 Gb/s). Serial data links have inherent problems with distortion as rates increase, requiring in many cases equalization stages on chip. At the present time high speed data links in modules, on boards, and on backplanes are typically accomplished with controlled impedance printed circuit board (PCB) transmission lines or copper to/from fiber optic translators. Most commercial devices launch data from the component with copper interconnects and use an external fiber optic translator. But interconnects made with PCB transmission lines are exposed to the lossy characteristics of the substrate upon which they are built. Advanced substrate materials such as Liquid Crystal Polymer (LCP) have helped to extend the frequency range (and bit rates) that can be handled. Still, the methods that have been used before are now becoming a limiting factor given the advances in chip speeds.

SUMMARY OF THE INVENTION

This disclosure concerns systems and methods for improving digital data communications on a micro-circuit substrate. The method can involve forming at least one digital data interconnect by disposing a plurality of material layers on a substrate to define a microstructure. The material layers form a conductive shield which has a tubular form and extends across a surface of the substrate. As used herein tubular encompasses any long tube-like structure with a polygonal cross section including circular, square or rectangular. The layers are further used to form a plurality of nonconductive straps which are periodically spaced along a length of the tubular form inside the conductive shield. Each strap extends between opposing walls of the conductive shield and is comprised of a dielectric material. The material layers arranged in a stack are further arranged to form a core which includes one or more conductors. The one or more conductors extends along the length of the tubular form parallel to the opposing walls and is/are suspended on the straps within the conductive shield. In this way, the one or more conductors within the shield is/are separated from the conductive shield by an air gap. The process continues by electrically connecting the one or more conductors of the digital data interconnect to an electrical contact of a first digital data device disposed on the substrate. Thereafter, digital data is communicated from the first digital data device to a second digital data device disposed on the substrate.

According to one aspect, the core of the microstructure is formed so as to include two conductors which extend along the length of the tubular form, parallel to the opposing walls. The two conductors are suspended on the straps within the conductive shield and are separated from the conductive shield by an air gap. The two conductors of the digital data interconnect are electrically connected to first and second electrical contacts of a first digital data device disposed on the substrate. Thereafter, digital data is communicated from the first digital data device to a second digital data device disposed on the substrate by using the first and second conductors to facilitate a differential signaling mode.

The invention also concerns a digital data processing system disposed on a substrate. The processing system includes a digital data device and at least one digital data interconnect disposed on the substrate. The digital data interconnect is a three-dimensional microstructure comprised of a plurality of material layers stacked to form a structure as described above. According to one aspect, the three-dimensional microstructure is a controlled impedance transmission line.

According to a further aspect, the invention concerns a three-dimensional microstructure for communicating digital data in accordance with a differential signaling mode. The microstructure is formed on a substrate and is comprised of a plurality of material layers which are stacked on the substrate. The stacked material layers define a three-dimensional structure which includes a conductive shield. The conductive shield has a tubular form and extends across a surface of the substrate. The material layers also define a plurality of straps which are periodically spaced along a length of the tubular form inside the conductive shield. Each strap extends between opposing walls of the conductive shield and is comprised of a dielectric material. A core comprising two conductors extends along the length of the tubular form parallel to the opposing walls and suspended on the straps within the conductive shield. The two conductors are separated from the conductive shield by an air gap. The three-dimensional microstructure is a differential controlled impedance transmission line.

BRIEF DESCRIPTION OF THE DRAWINGS

Embodiments will be described with reference to the following drawing figures, in which like numerals represent like items throughout the figures, and in which.

DETAILED DESCRIPTION

Figure 1:
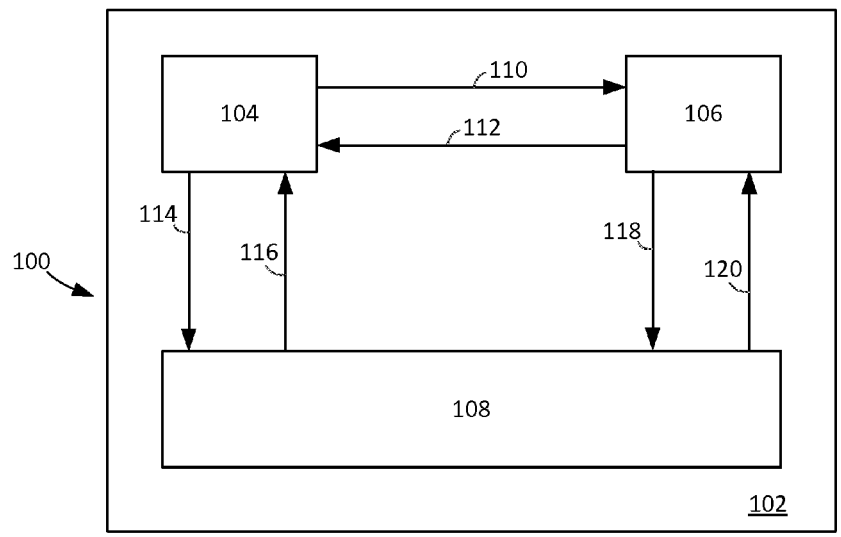
FIG. 1 is a block diagram of a first exemplary digital data circuit that is useful for understanding the inventive arrangements.

The invention is described with reference to the attached figures. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The invention is not limited by the illustrated ordering of acts or events, as some acts may occur in different orders and/or concurrently with other acts or events. Furthermore, not all illustrated acts or events are required to implement a methodology in accordance with the invention.

It should also be appreciated that the terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Further, unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to one aspect of the inventive arrangements, one or more microstructure waveguides are used to communicate and/or share digital data between one or more digital devices that are disposed on a common substrate. The microstructure waveguides have a coaxial configuration comprising an inner core and outer shield separated by an air gap. The microstructure waveguides facilitates high bit rate data transfers (above 100 Gb/s on each waveguide) which are well beyond conventional approaches employed for conventional digital data interconnects. The bandwidth available with the use of microstructure waveguides as described herein for data interconnects can facilitate the use of a single high speed serial data interconnect in place of a set of lower rate parallel data channels at the substrate level. Alternatively, a plurality of microstructure waveguides can be used to facilitate a parallel data transfer with a reduction in the overall number of required interconnects. The use of microstructure waveguides as described herein can allow a decrease in the number of data interconnects between two digital data devices by 65%, and in some scenarios by 90% or more. This approach saves space on a circuit substrate upon which the digital data devices are disposed, reduces cost and raises reliability.

Referring now to FIG. 1, a first exemplary arrangement is shown which comprises a data processing system 100. According to one aspect, the data processing system 100 can be a multi-chip module in which multiple integrated circuits (ICs), semiconductor dies and other components are integrated on a common substrate. In the example shown, a plurality of digital data devices 104, 106, 108 comprising the data processing system are disposed on a substrate 102. One or more of these digital data devices can comprise an IC and/or semiconductor die. The substrate 102 is a dimensionally stable and flat substrate. For example, the substrate 102 can be formed of silicon or glass. The digital data devices 104, 106, 108 can be any type of electronic digital data devices which communicate or share data using a plurality of digital data interconnects 110, 112, 114,116, 118, 120. For example, the digital data devices 104, 106 could each be comprised of a CPU. If the digital data devices 104, 106 are CPU's, the digital data interconnects 110, 112 can be understood to be processor data interconnects which facilitate interprocessor communications. In an exemplary embodiment, digital data device 108 can be comprised of one or more integrated circuit devices comprising a bridge chipset. In such a scenario, digital data interconnects 114, 116, 118, 120 can be understood to be bridge interconnects which facilitate communication of data to and from each of the digital data devices 104, 106. In some computing architectures, for example, 108 may be the CPU, with 106 being a North Bridge, South Bridge or I/O expander.

Figure 2:
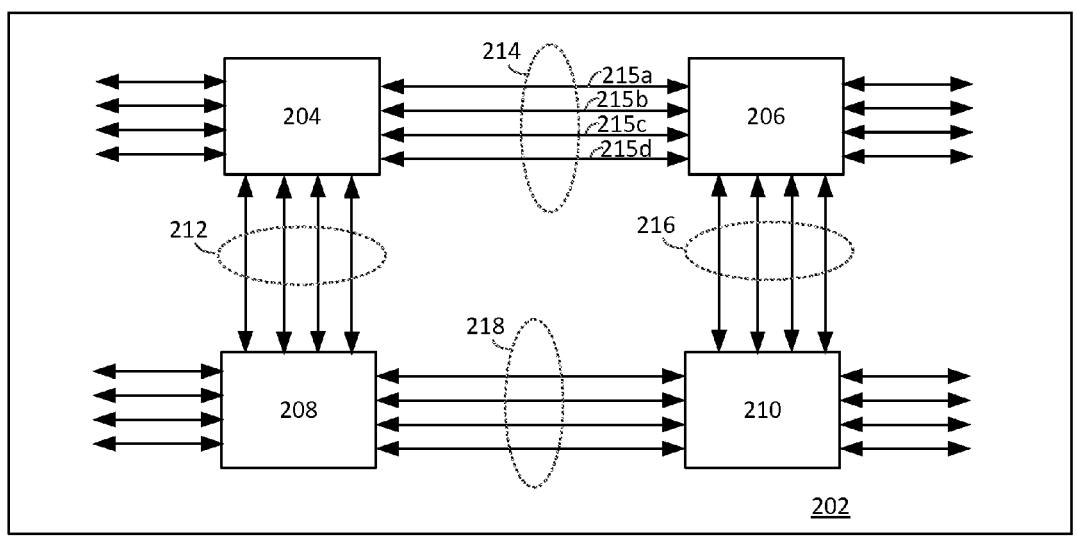
FIG. 2 is a block diagram of a second exemplary digital data circuit that is useful for understanding the inventive arrangements.

It will be appreciated that the particular architecture and interconnect arrangement shown in FIG. 1 is provided merely by way of example and not as a limitation. A second exemplary data processing system 200 is shown in FIG. 2. An interconnect arrangement is shown in FIG. 2 in which a plurality of digital data devices 204, 206, 208, 210 comprising a data processing system 200 are disposed on a substrate 202. Like data processing system 100, the data processing system 200 can also be a multi-chip module. Accordingly, one or more of the digital data devices which comprise data processing system 200 can be an IC and/or semiconductor die. The substrate 202 is a dimensionally stable and flat substrate. For example, the substrate 202 can be formed of silicon or glass. The digital data devices 204, 206, 208, 210 can be any type of electronic digital data devices which communicate or share data using a plurality of digital data interconnects. For example, the digital data devices in this example could interface FPGA processing elements arranged to form a mesh networking and switching system. Each device communicates with other devices using a set 212, 214, 216, 218 of digital data interconnects which are arranged in parallel. For example, individual data interconnects 215a, 215b, 215c, and 215d are identified in the case of set 214. Each set in this example includes four (4) individual data interconnect channels, but the invention is not limited in this regard.

For purposes of the present disclosure, a digital data device shall be understood to include any of a wide variety of digital devices which process, transmit, receive, buffer or otherwise perform operations upon digital data signals. As such, a digital data device can include a CPU, a GPU, an FPGA, an ASIC, an analog-to-digital converter (ADC), a digital-to-analog converter (DAC), an optical device interface or a digital data transceiver, without limitation.

Figure 3:
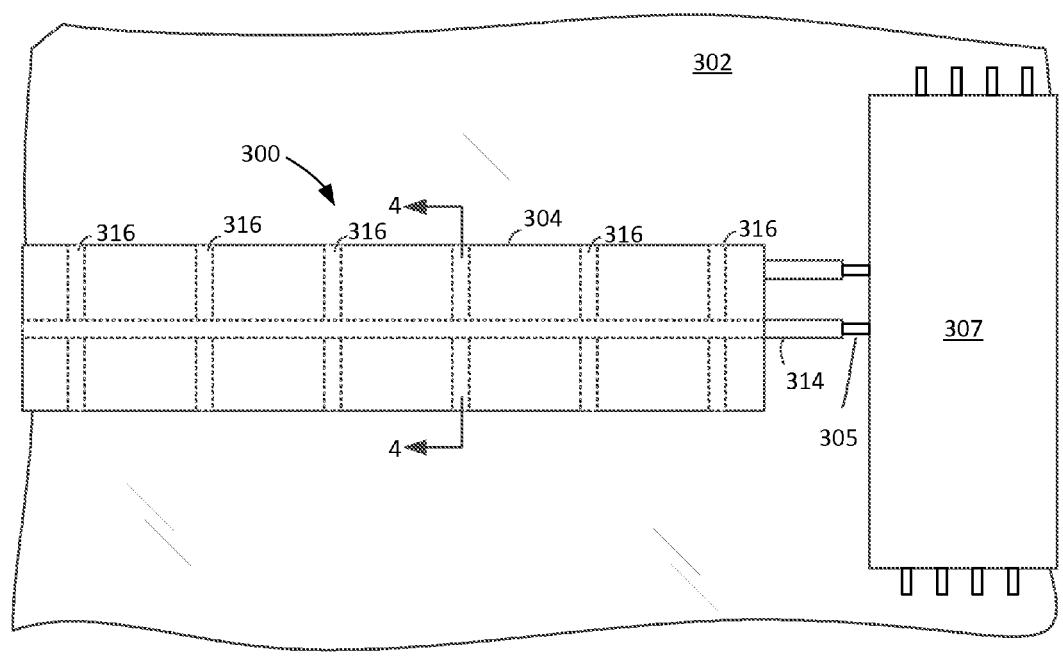
FIG. 3 is a top view of a digital data microstructure interconnect which can be used in a digital data circuit of FIGS. 1 and 2.

According to one aspect of the inventive arrangements, digital data interconnects 110, 112, 114, 116, 118, 120 and digital data interconnects 215a, 215b, 215c, and 215d can each be formed as a microstructure interconnect. A first exemplary microstructure interconnect 300 will now be discussed in relation to FIGS. 3-5. As illustrated therein, the microstructure interconnect 300 is formed on a substrate 302. The substrate 302 is preferably a dimensionally stable and flat substrate. In this regard, the substrate 302 can be formed of silicon, glass, rigid printed wiring board or other substantially flat and rigid material. The substrate may optionally contain active circuit devices as part of a wafer or imbedded as chips in said substrate and the microstructure waveguides may be disposed thereon. If the microstructure interconnect 300 is used as a digital data interconnect between two digital data devices as described herein, the substrate 302 can be the same substrate upon which the digital data devices are disposed. The substrate may also contain other electrical lines, such as copper traces. The substrate may also comprise a wafer with active devices that are connected by said microstructure interconnect and additionally by copper traces or other forms of relatively low speed interconnects.

Figure 4:
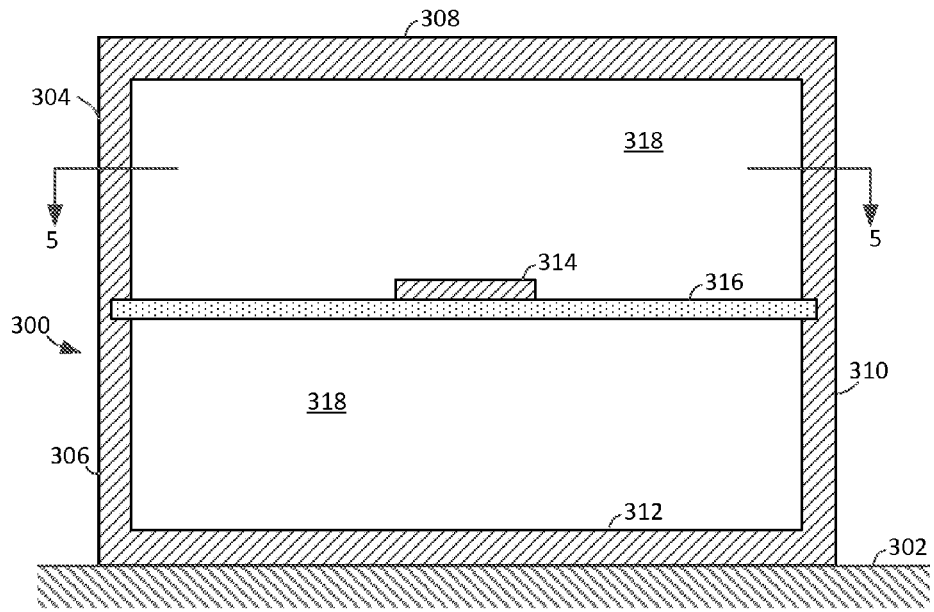
FIG. 4 is a cross-sectional view of the digital data microstructure interconnect in FIG. 3, taken along line 4-4.
Figure 5:
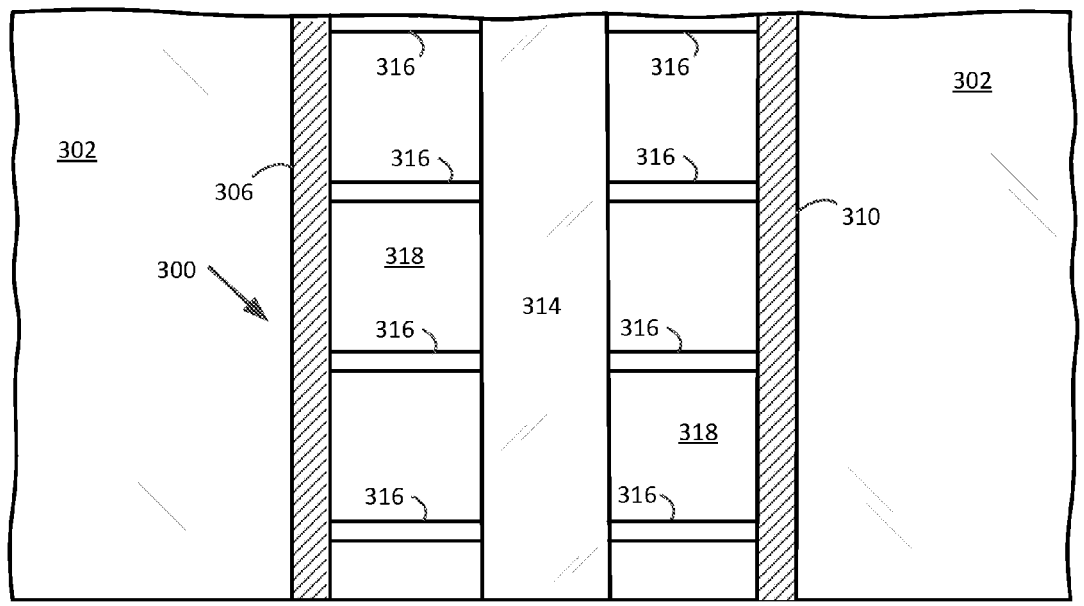
FIG. 5 is a cross-sectional view of the digital data microstructure interconnect in FIG. 4, taken along line 5-5.

The microstructure interconnect 300 shown in FIG. 4 comprises a shield 304 surrounding a core 314 to form a coaxial arrangement. The shield is comprised of a top wall 308, a bottom wall 312 and sidewalls 306, 310. The shield can have a rectangular cross-sectional profile as shown, but it not limited in this regard. For example, a square cross-sectional profile could also be used. According to one aspect of the invention, the core can be comprised of an elongated conductor positioned so that the core is approximately centered or coaxial with the shield as shown. The shield and core are both formed of a conductive material (e.g., solid copper) and have a thickness (e.g., at least about 50µ) selected to ensure deformation thereof will not occur over time. An air gap 318 is provided between the shield 304 and core 314 along their entire lengths. In this regard, the core 314 is suspended within the shield 304 via a plurality of straps 316. The straps are formed of a dielectric material (e.g., a Su-8 epoxy), and are periodically spaced along the length of the core 314 as shown in FIG. 5. Each strap extends perpendicular to the core 314 between two sidewalls 306 and 310 of the shield 304. The spacing between the sidewalls 306, 310 and the core 314 are substantially the same along the entire length of the microstructure interconnect 300. Similarly, the spacing between the core 314 and each of the top wall 308 and bottom wall 312 are substantially constant along the entire length of the microstructure interconnect 300. The microstructure interconnect structure shown in FIGS. 3-5 has superior loss and dispersion characteristics that can enable data interconnects which run at greater than 100 Gb/s and are compatible with Integrated Circuit ("IC") and optical device interfaces.

The fabrication of the microstructure interconnect as described herein is advantageously performed using a semiconductor lithography based process. Semiconductor lithography based processes for forming micro-circuit components are well known in the art, and therefore will not be described herein. Any known or to be known semiconductor lithography based process can be used herein without limitation. Still, it should be understood that the semiconductor lithography based process generally involves sequentially disposing a plurality of material layers on the substrate and removing photoresist layers so as to leave a desired electronic circuit pattern (formed of dielectric and conductive materials) on the substrate. This concept is illustrated in FIG. 6 which shows an exemplary microstructure interconnect 600 which is similar to the microstructure interconnect 300.

Figure 6:
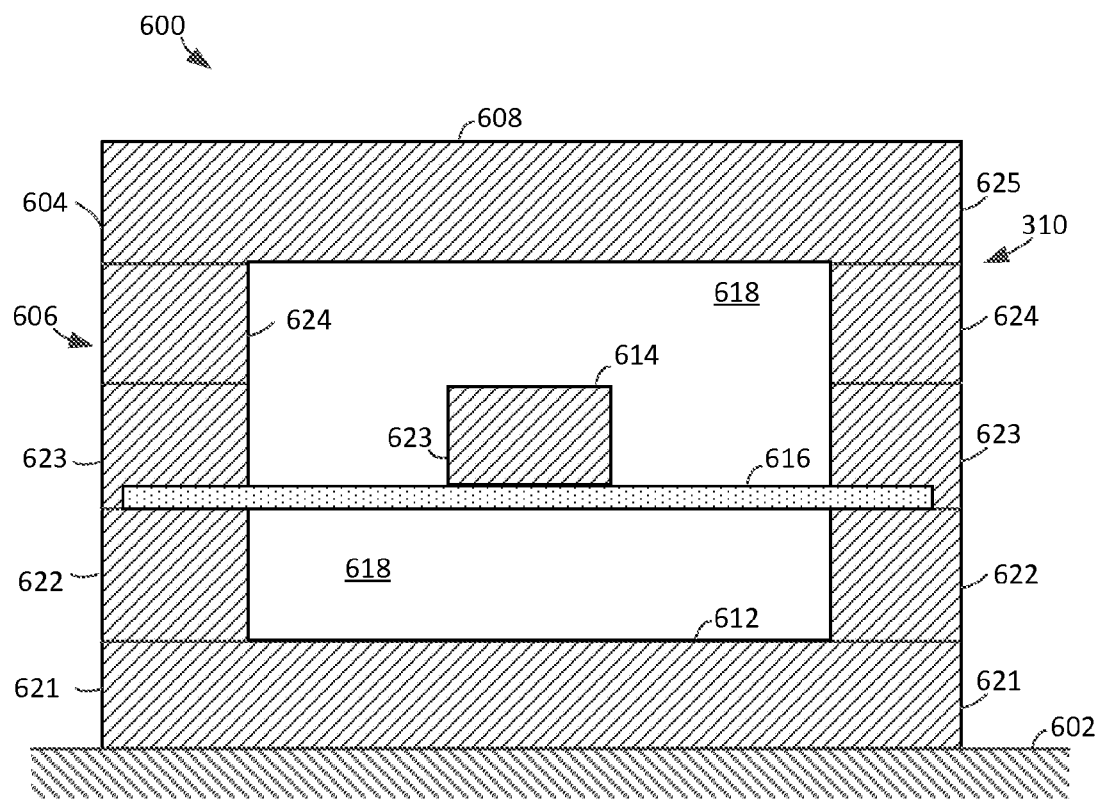
FIG. 6 is a cross-sectional view of the digital data microstructure interconnect in FIG. 3 which is useful for understanding how a plurality of material layers are deposited to form the microstructure on a substrate.

It can be observed in FIG. 6 that the microstructure interconnect 600 is constructed on a substrate 602 and is comprised of a plurality of sequentially deposited material layers 621-625. The microstructure interconnect 600 as formed comprises a shield 604 surrounding a core 614 to form a coaxial arrangement. The shield is comprised of a top wall 608, a bottom wall 612 and sidewalls 606, 610. The shield and core are formed of a conductive material and have a thickness (e.g., at least about 50µ) selected to ensure deformation thereof will not occur over time. An air gap 618 is provided between the shield 604 and core 614 along their entire lengths. In this regard, the core 614 is suspended within the shield 604 via a plurality of straps 616. The straps are formed of a dielectric material (e.g., a Su-8 epoxy), and are periodically spaced along the length of the core 614. The structure 600 of FIG. 6 is a five-layer design. Variants of this structure including additional layers are also possible. For example, to facilitate interconnection to a device it may be advantageous to elevate the microstructure above the substrate by including spaced standoffs between the substrate 602 and the first layer of the microstructure 621. Such standoffs may comprise a conductive or non-conductive material built in an additional initial step upon the substrate 602. Notably, the ability to concurrently fabricate a plurality of such microstructure interconnects via a semiconductor lithography based process results in a decreased overall fabrication cost for an electronic circuit as compared to that of electronic circuits employing conventional wire or ribbon interconnects.

According to a further aspect of the inventive arrangements, digital data interconnects 110, 112, 114, 116, 118, 120 and digital data interconnects 215a, 215b, 215c, and 215d can be formed as a differential interconnect microstructure (DIMS) which is fabricated on a base substrate. Forming each of these digital data interconnects as a DIMS enables faster data transport between devices and increased robustness against electrical signal reflections at physical transitions. As such, the DIMS can be used in any scenario where a high speed link is needed for communicating data between digital devices such as CPUs, GPUs, ADCs, DACs and FPGAs disposed on a common substrate. As explained below, the DIMS is particularly advantageous (as compared to conventional differential signaling structures) in those scenarios where differential cross-talk caused by adjacent data lines is a design concern.

Single ended signaling involves communicating electronic signals using a single wire and a return path, usually a ground. A receiving circuit extracts data from the signal by responding to electrical differences (e.g. voltage) between the single wire and the ground. In contrast, differential signaling generally involves electrically transmitting data using two complementary signals which are identical except for being opposite in polarity. In such systems, each of the two complementary signals is respectively communicated in a separate conductor. Together the two conductors comprise a differential pair. The pair of conductors can be wires (e.g. a twisted pair) or traces disposed on a circuit substrate. For purposes of extracting the data which has been communicated, the receiving circuit in such systems is arranged to respond to the difference between the two differential signals.

Differential signaling is inherently resistant to common-mode noise. Common-mode noise is defined as electrical noise which is in-phase and identically present on each conductor of the differential conductor pair. A properly functioning differential amplifier at a differential pair data receiver will automatically eliminate most common-mode noise, since the noise on one conductor will be subtracted from the noise on the other conductor. The limit of such rejection is determined by the common-mode rejection ratio of the differential amplifier. In contrast, differential mode noise is defined as electrical noise which is different on each conductor of the differential conductor pair. In some scenarios, the differential mode noise may be similar in each conductor, but out of phase. Differential signaling systems are considerably less effective at reducing or eliminating differential mode noise as compared to common-mode noise. Still, differential signaling offers significant advantages over single ended signaling insofar as noise is concern.

Digital data interconnects links disposed on a substrate are subject to experiencing crosstalk noise from system clocks and other nearby data interconnects. Crosstalk can be understood as electrical data signals which are undesirably coupled from one data link to another nearby data link which may be on the same substrate. Crosstalk noise on a differential conductor pair often has a substantial common-mode component, but it can also include a differential component. The differential component usually arises when the distance between a noise source and each conductor of the differential conductor pair is different. Consequently, the noise signal coupled to each conductor of the differential pair will be slightly different, and may be out of phase. The crosstalk noise can be reduced by increasing the spacing between the individual digital interconnects on a substrate, but this will limit design flexibility and can increase the substrate area required to implement the design. The DIMS described herein enables data transport between devices on a substrate at very high data rates (e.g. greater than 100 Gb/s), eliminates the negative effects of common-mode noise, and reduces the those of differential-mode noise. Such results can be achieved while allowing very close spacing of such data interconnects on the base substrate, since each differential interconnect features a continuous shield 704. Because of its inherent resistance to noise, a DIMS as described herein has the added benefit of facilitating the use of lower voltages for the data signals, which saves power and reduces emitted electromagnetic radiation.

An exemplary DIMS 700 will now be discussed in relation to FIGS. 7 and 8. As illustrated therein the DIMS 700 is formed on a substrate 702. If the DIMS is used as digital data interconnect between two digital data devices, the substrate 702 can be the same substrate upon which the digital data devices are disposed. The substrate 702 is a dimensionally stable and flat substrate. For example, the substrate 702 can be formed of silicon or glass, and may optionally contain active circuit devices as part of a wafer or embedded as chips in said substrate and the DIMS may be disposed thereon.

The DIMS 700 comprises a shield 704 surrounding a dual conductor core comprised of first conductor 714a and second conductor 714b which are disposed in a parallel relationship as shown. The shield is comprised of a top wall 708, a bottom wall 712 and sidewalls 706, 710. The shield can have a rectangular cross-sectional profile as shown, but it not limited in this regard. For example, a square cross-sectional profile could also be used. The shield and the conductors 714a, 714b comprising the dual conductor core are both formed of a conductive material (e.g., solid copper) and have a thickness (e.g., at least 5μ) selected to ensure deformation thereof will not occur over time. An air gap 718 is provided between the shield 704 and the conductors 714a, 714b along their entire lengths.

The dual conductor core is suspended within the shield 704 via a plurality of straps 716. According to one aspect of the invention, the center line of the dual core can be positioned so that it is approximately centered or coaxial with shield as shown. The straps are formed of a dielectric material (e.g., a Su-8 epoxy), and are periodically spaced along the length of the dual conductor core, as illustrated in FIG. 8. Each strap extends perpendicular to the conductors 714a, 714b of the dual conductor core 714 between two sidewalls 706 and 710 of the shield 704. The spacing between the sidewalls 706, 710 and each of the conductors of the dual conductor core 714 is substantially constant along the entire length of the DIMS 700. Similarly, the spacing between each of the conductors of the dual conductor core 714 and each of the top wall 708 and bottom wall 712 are substantially constant along the entire length of the DIMS 700. The structure 700 of FIG. 7 can also contain additional features. For example, to facilitate interconnection to a device it may be advantageous to elevate the microstructure above the substrate by including spaced standoffs between the substrate 702 and the bottom wall 712 of the microstructure. Such standoffs may comprise a conductive or non-conductive material built in an additional initial step upon the substrate 702.

The fabrication of the DIMS 700 is performed using a semiconductor lithography based process. Semiconductor lithography based processes for forming micro-circuit components are well known in the art, and therefore will not be described herein. Any known or to be known semiconductor lithography based process can be used herein without limitation. Still, it should be understood that the semiconductor lithography based process generally involves sequentially disposing a plurality of material layers similar to the material layers shown in FIG. 6. The material layers are sequentially deposited and photoresist layers are removed as needed so as to leave a desired electronic circuit pattern (formed of dielectric and conductive materials) on the substrate. Notably, the ability to concurrently fabricate a plurality of microstructure interconnects via a semiconductor lithography based process results in a decreased overall fabrication cost for an electronic circuit as compared to that of electronic circuits employing conventional wire or ribbon interconnects.

Figure 7:
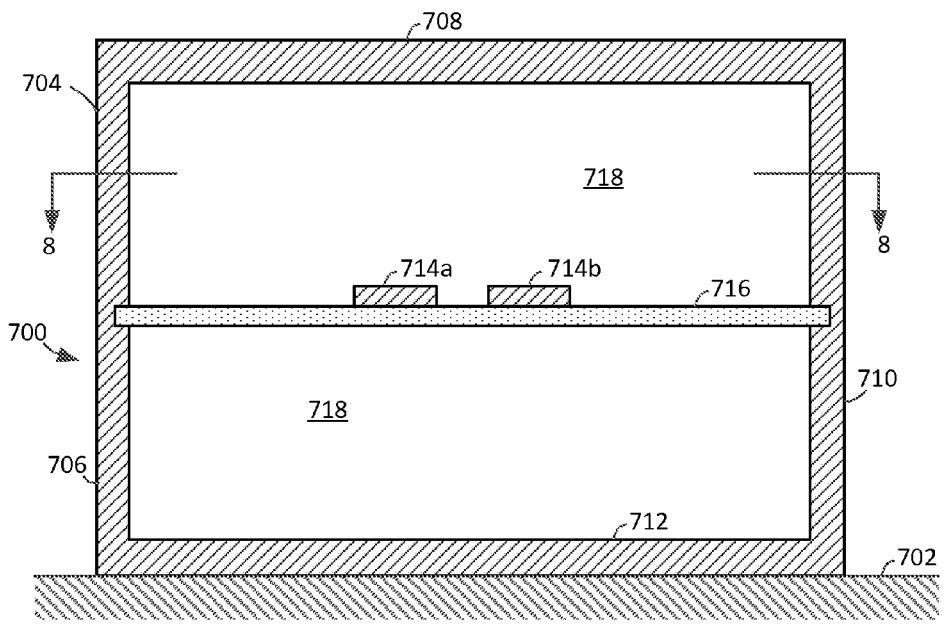
FIG. 7 is a cross-sectional view of an alternative digital data microstructure interconnect which can be used in a digital data circuit of FIGS. 1 and 2.
Figure 8:
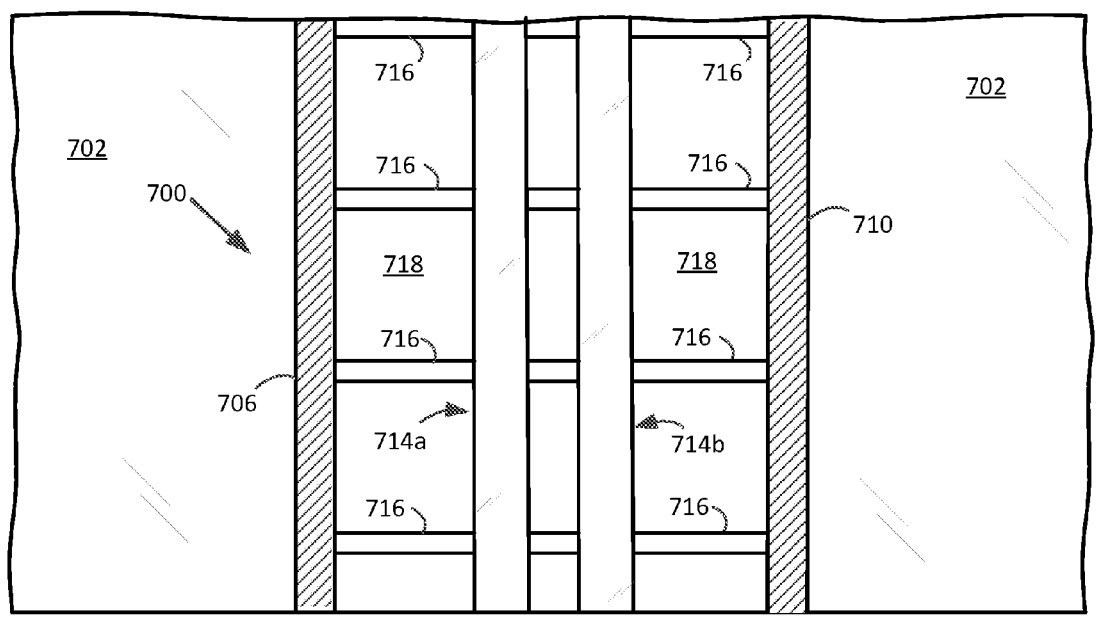
FIG. 8 is a cross-sectional view of the microstructure interconnect in FIG. 7, taken along line 8-8.

The DIMS interconnect structure shown in FIGS. 7-8 has superior loss and dispersion characteristics that can enable digital data interconnects which run at greater than 100 Gb/s. The DIMS facilitates high-speed data communications between digital data devices disposed on the substrate, with reduced crosstalk facilitated by the conductive shield, while efficiently utilizing available substrate area. This arrangement allows all the benefits of differential signaling, but with potentially higher data rates because of reduction in differential-mode noise as compared to conventional differential signaling structures. This allows interconnects among digital data devices to have higher speeds, reduced usage of substrate space, and potentially lower power consumption facilitated by the reductions in electrical noise.

Figure 9:
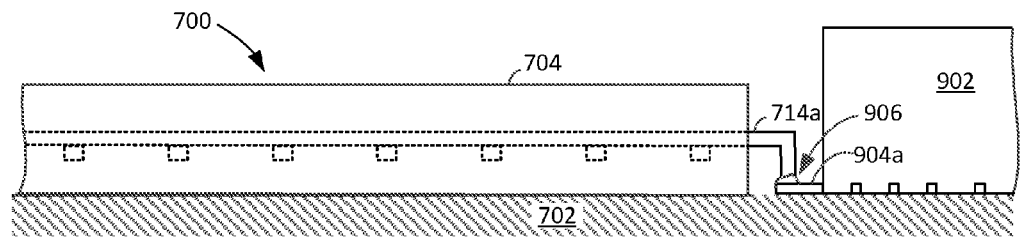
FIG. 9 is a side view of the microstructure interconnect of FIGS. 7 and 7, shown connected to an integrated circuit disposed on the substrate.
Figure 10:
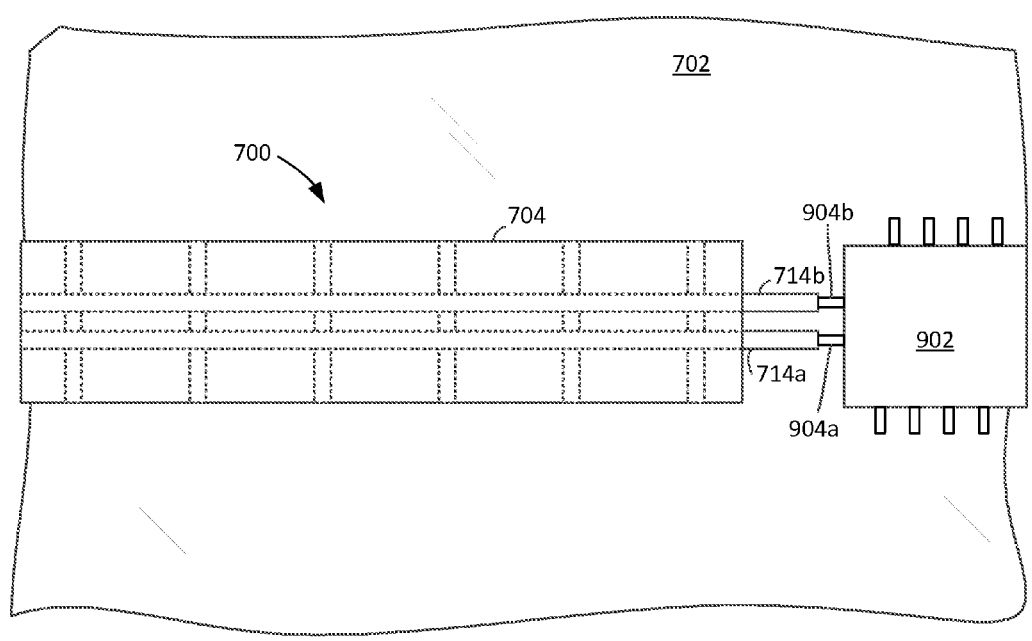
FIG. 10 is a top view of the microstructure interconnect in FIG. 9.

The interconnect microstructures shown in FIGS. 7 and 8 are advantageously suited for data communications between integrated circuits disposed on a substrate and semiconductor dies disposed in a multi-chip module. These types of digital data devices, as well as others, including optical device interfaces can benefit from the use of the interconnect structures described herein. Such a scenario is shown in FIGS. 9 and 10. As illustrated therein, one or more conductors (e.g. conductors 714a, 714b) associated with the core of a DIMS 700 can have an extension which is electrically coupled to a corresponding electrical contact 904a, 904b of a semiconductor die or an integrated circuit device 902. For example in the case of DIMS 700, the electrical contacts 904a, 904b can be differential inputs to a differential receiver, transmitter or transceiver. The shield 704 can also be coupled to a corresponding contact of the device 902. The electrical coupling to contacts 904a, 904b can be achieved using any known or to be known electrical coupling technique, such as soldering or adhesion (e.g., via a conductive epoxy) or wire bonding. If soldering is used, then solder bumps 906 can create the electrical connections between the device 902 and core conductor.

Figure 11:
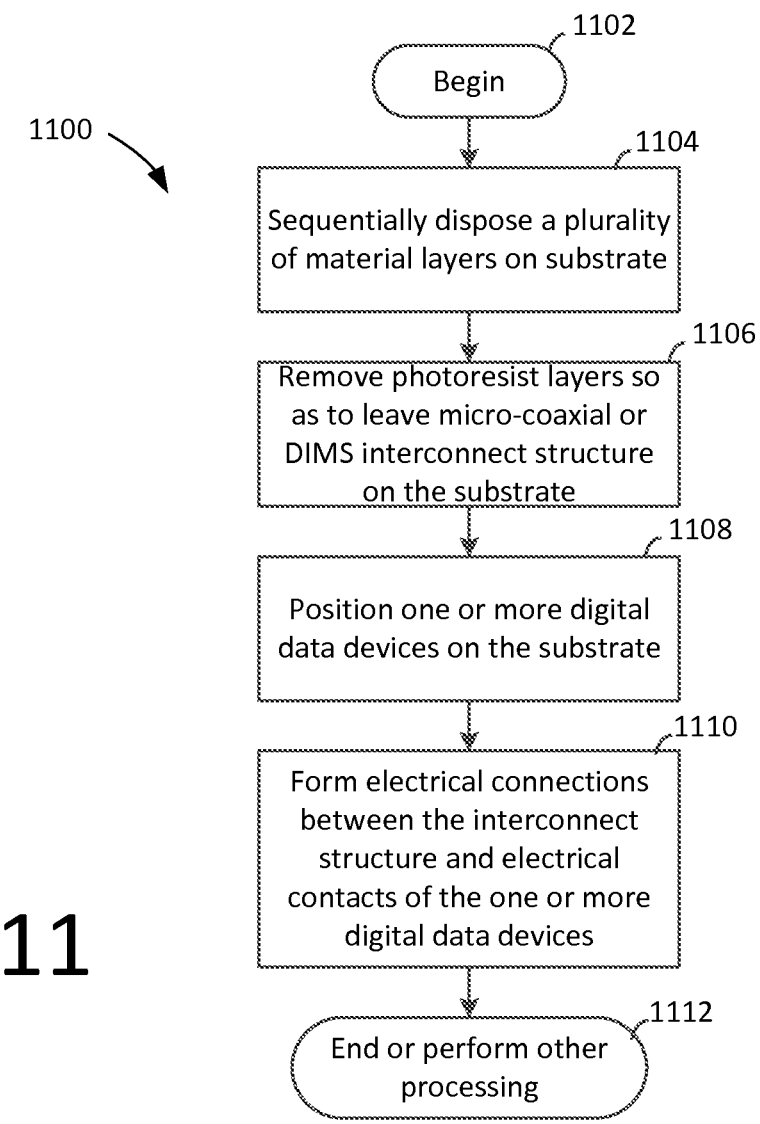
FIG. 11 is a flow diagram of an exemplary method for fabricating a microstructure interconnect as described herein.

Referring now to FIG. 11, there is provided a flow diagram of an exemplary method 1100 for fabricating a digital data circuit as described herein. The process can begin at 1102 and continues at 1104, where a plurality of material layers are sequentially disposed on a substrate. The plurality of layers can include metal layers, dielectric layers, and photoresist layers as needed to form a microstructure similar to that which has been described herein. At 1106, the photoresist layers are removed so as to leave a microstructure as described herein on the substrate. Thereafter, the fabrication of the digital data circuit can continue at 1108 with the positioning of two or more integrated circuit digital data devices on the substrate. The digital data devices can be optical data transceivers, CPUs, GPUs, ADCs, DACs, FPGAs or any other type of digital data device. At 1110, electrical connections are formed as necessary between the microstructure as described and electrical contacts of the digital data device. At 1112 the process can terminate or continue with other fabrication steps.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application. Thus, the breadth and scope of the present invention should not be limited by any of the above described embodiments. Rather, the scope of the invention should be defined in accordance with the following claims and their equivalents.

We claim:

1. A method for reducing a number of physical data channels required to support a communication bandwidth of a digital data device disposed on a substrate, comprising:
    forming at least one digital data interconnect by disposing a plurality of material layers on a substrate to define a microstructure which includes
        a conductive shield disposed on the substrate so as to have a tubular form and extend across a surface of the substrate whereby a signaling channel is defined that is entirely surrounded by a conductive material,
        a plurality of straps periodically spaced along a length of the tubular form inside the conductive shield, each strap extending between opposing walls of the conductive shield and comprised of a dielectric material, and
        a core comprising at least one conductor which extends along the length of the tubular form parallel to the opposing walls and suspended on the straps within the conductive shield, with the at least one conductor separated from the conductive shield by an air gap;
    electrically connecting each of the conductive shield and the at least one conductor of the digital data interconnect to an electrical contact of a first digital data device disposed on the substrate; and
    communicating digital data from the first digital data device to a second digital data device disposed on the substrate.

2. The method according to claim 1, wherein the core is formed so as to include only a single conductor which is coaxially disposed within the conductive shield.

3. The method according to claim 1, wherein the core is formed to include a plurality of the conductors, including a first conductor and a second conductor, which are spaced apart by a predetermined distance.

4. The method according to claim 3, wherein the first and second conductors are electrically connected to the first digital data device, and further comprising using a differential signaling process to communicate the digital data over the first and second conductors.

5. The method according to claim 4, further comprising using said conductive shield to reduce a coupling of differential-mode noise to the first and second conductors.

6. The method according to claim 1, further comprising forming the digital data interconnect using a semiconductor lithography based process.

7. The method according to claim 1, wherein the microstructure further includes at least one standoff elevating the microstructure above the substrate by a predefined distance.

8. A digital data processing system comprising:
    a substrate;
    a digital data device disposed on the substrate; and
    at least one digital data interconnect disposed on the substrate and comprised of a plurality of material layers stacked on the substrate;
    wherein the plurality of material layers define a three-dimensional microstructure which includes
        a conductive shield which has a tubular form and extends across a surface of the substrate so as to define a signaling channel that is entirely surrounded by a conductive material,
        a plurality of straps periodically spaced along a length of the tubular form inside the conductive shield, each strap extending between opposing walls of the conductive shield and comprised of a dielectric material, and
        a core comprising at least one conductor which extends along the length of the tubular form parallel to the opposing walls and suspended on the straps within the conductive shield, with the at least one conductor separated from the conductive shield by an air gap; and
    wherein each of the conductive shield and the at least one conductor is electrically connected to an electrical contact of the digital data device and the at least one conductor is arranged to communicate digital data from the digital data device to a second digital data device.

9. The digital data processing system according to claim 8, wherein the at least one conductor is connected to an electrical contact of the second digital data device which is also disposed on the substrate.

10. The digital data processing system according to claim 8, wherein the core is formed so as to include only a single conductor which is coaxially disposed within the conductive shield.

11. The digital data processing system according to claim 8, wherein the core is formed to include a plurality of the conductors, including a first conductor and a second conductor, which are spaced apart by a predetermined distance.

12. The digital data processing system according to claim 11, wherein the first and second conductors are electrically connected to the first digital data device, and wherein the first digital data device includes a differential transceiver circuit which is arranged to communicate the digital data over the first and second conductors using differential signaling, to a second digital data device.

13. A method for providing high speed data communications between a plurality of digital data devices disposed on a common substrate, comprising:
forming at least one digital data interconnect by disposing a plurality of material layers on a substrate to define a microstructure which includes
a conductive shield disposed on the substrate so as to have a tubular form and extend across a surface of the substrate whereby a differential signaling channel is defined that is entirely surrounded by a conductive material and enables each of two complimentary signals to be respectively communicated in a separate conductor,
a plurality of straps periodically spaced along a length of the tubular form inside the conductive shield, each strap extending between opposing walls of the conductive shield and comprised of a dielectric material, and
a core comprising two conductors which extends along the length of the tubular form parallel to the opposing walls and suspended on the straps within the conductive shield, with the two conductors separated from the conductive shield by an air gap;
electrically connecting each of the conductive shield and the two conductors of the digital data interconnect to electrical contacts of a first and second digital data device disposed on the substrate; and
communicating digital data from the first digital data device to the second digital data device disposed on the substrate by using the first and second conductors to facilitate a differential signaling mode.

14. The method according to claim 13, wherein the two conductors include a first conductor and a second conductor and the first conductor is spaced apart a predetermined distance from the second conductor.

15. The method according to claim 13, further comprising using said conductive shield to reduce the presence of differential-mode noise on the first and second conductors.

16. The method according to claim 13, further comprising forming the at least one digital data interconnect using a semiconductor lithography based process.

17. A microstructure for communicating digital data in accordance with a differential signaling mode, comprising:
a substrate;
a plurality of material layers stacked on the substrate, the stacked material layers defining a three-dimensional structure which includes
a conductive shield which has a tubular form and extends across a surface of the substrate to at least partially define a differential signaling channel that is entirely surrounded by a conductive material even when the microstructure is electrically connected to one or more digital data devices,
a plurality of straps periodically spaced along a length of the tubular form inside the conductive shield, each strap extending between opposing walls of the conductive shield and comprised of a dielectric material, and
a core comprising two conductors which extend along the length of the tubular form parallel to the opposing walls and suspended on the straps within the conductive shield, with the two conductors separated from the conductive shield by an air gap.

18. The microstructure according to claim 17, further comprising:
a digital data device disposed on the substrate, the digital data device including at least one differential-mode transceiver circuit; and
wherein the two conductors of said three-dimensional structure include a first conductor and a second conductors which are each electrically connected to differential input terminals of the at least one differential mode transceiver circuit.

19. The microstructure according to claim 17, wherein the two conductors of said three-dimensional structure are spaced apart by a predetermined distance.

* * * * *